United States Patent [19]

Sih

[11] Patent Number: 5,644,596

[45] Date of Patent: Jul. 1, 1997

[54] METHOD AND APPARATUS FOR FREQUENCY SELECTIVE ADAPTIVE FILTERING

[75] Inventor: Gilbert C. Sih, San Diego, Calif.

[73] Assignee: Qualcomm Incorporated, San Diego, Calif.

[21] Appl. No.: 528,391

[22] Filed: Sep. 13, 1995

Related U.S. Application Data

[63] Continuation of Ser. No. 189,819, Feb. 1, 1994, abandoned.

[51] Int. Cl.$^6$ ..................... H03H 7/30
[52] U.S. Cl. ............... 375/232; 375/349; 375/350; 370/290; 370/291; 370/488; 379/410; 379/411; 364/724.19
[58] Field of Search .................... 375/260, 285, 375/229, 232, 346, 349, 350; 379/3, 406, 407, 410, 411; 370/6, 32.1, 70, 290, 291, 488; 364/724.19

[56] References Cited

U.S. PATENT DOCUMENTS

| | | | |
|---|---|---|---|
| 4,956,838 | 9/1990 | Gilloire et al. | 370/32.1 |
| 5,136,577 | 8/1992 | Amano et al. | 370/32.1 |
| 5,272,695 | 12/1993 | Makino et al. | 370/32.1 |
| 5,305,307 | 4/1994 | Chu | 370/32.1 |
| 5,329,587 | 7/1994 | Morgan et al. | 370/32.1 |

OTHER PUBLICATIONS

Fumio Amano and Hector Perez, *A New Subband Echo Canceler Structure*, Jul. 1991, IEEE, pp. 3585–3588.

Steven L. Gay and Richard J. Mammone, *Fast Converging Subband Acoustic Echo Cancellation Using Rap on the WE® DSP16A*, Feb. 1990, IEEE, pp. 1141–1144.

Andre Gilloire et al., *Adaptive Filtering in Sub-Bands*, Sep. 1988, IEEE, pp. 1572–1575.

Andre Gilloire, *Experiments with Sub-Band Acoustic Echo Cancellers for Teleconferencing*, 1987, IEEE, pp. 2141–2144.

*Primary Examiner*—Stephen Chin
*Assistant Examiner*—Amanda T. Le
*Attorney, Agent, or Firm*—Russell B. Miller; Sean English; Linli L. Golden

[57] ABSTRACT

A method and apparatus for performing subband adaptive filtering is proposed. A signal is prefiltered by a set of complementary filters to provide corresponding subbands of the input signal. The subbands of the signal are then provided to adaptive filters that filter the subbands separately. The individually filtered subbands are then summed. In an exemplary implementation an echo canceller is presented which employs the subband filtering method and apparatus.

6 Claims, 2 Drawing Sheets

PRIOR ART

METHOD AND APPARATUS FOR FREQUENCY SELECTIVE ADAPTIVE FILTERING

This is a continuation of application Ser. No. 08/189,819 filed Feb. 1, 1994 now abandoned.

BACKGROUND OF THE INVENTION

I. Field of the Invention

The present invention relates to digital signal processing. More particularly, the present invention relates to a novel and improved method and apparatus for adaptive filtering.

II. Description of the Related Art

Adaptive filters have been widely used in communications systems, control systems and various other systems in which the statistical characteristics of the signals to be filtered are either unknown a priori or, in some cases, slowly time-variant (nonstationary signals). Some applications of adaptive filters include adaptive antenna systems in which adaptive filters are used for beam steering and for providing null in the beam pattern to remove undesired interference, digital communication receivers in which adaptive filters are used to provide equalization of intersymbol interference and for channel identification, adaptive noise canceling techniques in which an adaptive filter is used to estimate and eliminate a noise component in some desired signal and system modeling in which an adaptive filter is used as a model to estimate the characteristics of an unknown system.

Although both infinite impulse response (IIR) and finite impulse response (FIR) filters have been considered for adaptive filtering, the FIR filter is by far the most practical and widely used. The reason for this preference is quite simple. The FIR filter has only adjustable zeroes and hence it is free of stability problems associated with adaptive IIR filters that have adjustable poles as well as zeroes. This does not mean, however, that adaptive FIR filters are always stable. On the contrary, the stability of the filter depends critically upon the algorithm used for adjusting its coefficients.

An important consideration in the use of an adaptive filter is the criterion for optimizing the adjustable filter parameters. The criterion must not only provided a meaningful measure of filter performance, but it must also result in a practically realizable algorithm.

For example, a desirable performance index in a digital communication system is the average probability of error. Consequently, in implementing an adaptive equalizer, a method wherein the selection of equalizer coefficients to minimize the average probability of error as the basis for the optimization criterion may be best suited. Unfortunately, however, the performance index (average probability of error) for this criterion is a highly nonlinear function of the filter coefficients. Although a number of algorithms are known for finding a minimum or maximum of a nonlinear function of several variables, such algorithms are unsuitable for adaptive filtering primarily because the signal statistical characteristics are unknown and possibly time variant.

In some cases a performance index that is a nonlinear function of the filter parameters possesses many relative minima (or maxima), so that one is not certain whether the adaptive filter has converged to the optimum solution or to one of the relative minima (or maxima). For these reasons, some desirable performance indices, such as the average probability of error in a digital communication system, must be rejected of the grounds that they are impractical to implement.

One criterion that provides a good measure of performance in adaptive filtering applications is the least-squares criterion, and its counterpart in a statistical formulation of the problem, namely, the mean-square-error (MSE) criterion. The least-squares (and the MSE) criterion result in a quadratic performance index as a function of the filter coefficients and hence it possesses a single minimum. The resulting algorithms for adjusting the coefficients of the filter are relatively easy to implement.

SUMMARY OF THE INVENTION

The present invention is a novel and improved method and apparatus for implementing an adaptive filter. In the present invention, the signal to be filtered is subband filtered and each band is provided to a separate adaptive filter. Each adaptive filter filters only the frequency band of the signal provided to it and its filter parameters are updated in accordance with the statistics of the frequency band of the signal which it is filtering.

In addition, an improved method and apparatus for performing echo canceling is presented which employs the frequency selective adaptive filters of the present invention.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
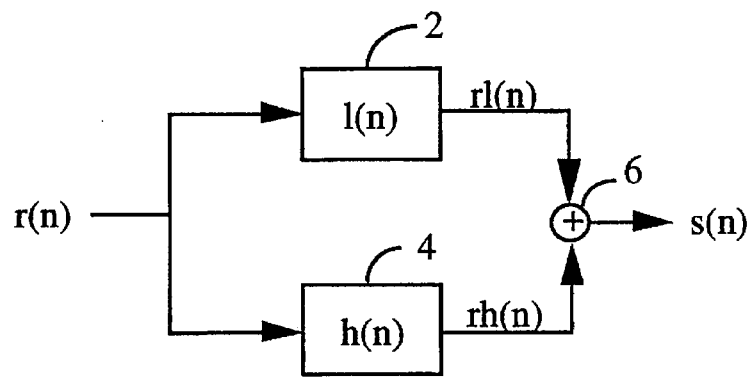
FIG. 1 is a block diagram of complementary filters.

Referring now to the figures, FIG. 1 illustrates complementary filters. In FIG. 1, an input signal r(n) is decomposed into a lowpass signal rl(n) by lowpass filter 2 with impulse response l(n), and a highpass signal rh(n) by highpass filter 4 with impulse response h(n).

Lowpass filter 2 and highpass filter 4 are complementary if they satisfy the following two conditions:

$l(n)$ and $h(n)$ have the same length $M$, where $M$ is odd (1)

and $$h(i) = \begin{cases} 1 - l(i) & i = \frac{M-1}{2} \\ -l(i) & \text{else} \end{cases} \quad (2)$$

If lowpass filter 2 and highpass filter 4 are complementary, the decomposition of r(n) into rl(n) and rh(n) introduces no distortion; that is, the sum of rl(n) and rh(n) is merely a delayed version of r(n). In order to illustrate this, consider the following. Lowpass received signal rl(n) can be expressed as:

$$rl(n) = \sum_{i=0}^{M-1} l(i)r(n-i) = l(0) \cdot r(n) + \ldots + \quad (3)$$

$$l\left(\frac{M-1}{2}\right) \cdot r\left(n - \frac{M-1}{2}\right) + \ldots +$$

$$l(M-1) \cdot r(n-M+1)$$

Similarly, the highpass received signal rh(n) may be expressed as:

$$rh(n) = \sum_{i=0}^{M-1} h(i)r(n-i) = h(0) \cdot r(n) + \ldots + \quad (4)$$

$$h\left(\frac{M-1}{2}\right) \cdot r\left(n - \frac{M-1}{2}\right) + \ldots +$$

$$h(M-1) \cdot r(n-M+1)$$

Therefore, $$s(n) = rl(n) + rh(n) = \sum_{i=0}^{M-1} [l(i) + h(i)] \cdot r(n-i). \quad (5)$$

If l(n) and h(n) are complementary, then $$l(i) + h(i) = 0, \forall i \text{ except } \frac{M-1}{2} \quad (6)$$

so $$s(n) = rl(n) + rh(n) = \quad (7)$$

$$\left[ l\left(\frac{M-1}{2}\right) + h\left(\frac{M-1}{2}\right) \right] \cdot r\left(n - \frac{M-1}{2}\right).$$

However, since $$l\left(\frac{M-1}{2}\right) + h\left(\frac{M-1}{2}\right) = 1, \quad (8)$$

s(n) can be expressed as:

$$s(n) = rl(n) + rh(n) = r\left(n - \frac{M-1}{2}\right), \quad (9)$$

which corresponds to a pure delay of $$\frac{M-1}{2}$$

samples.

Figure 2:
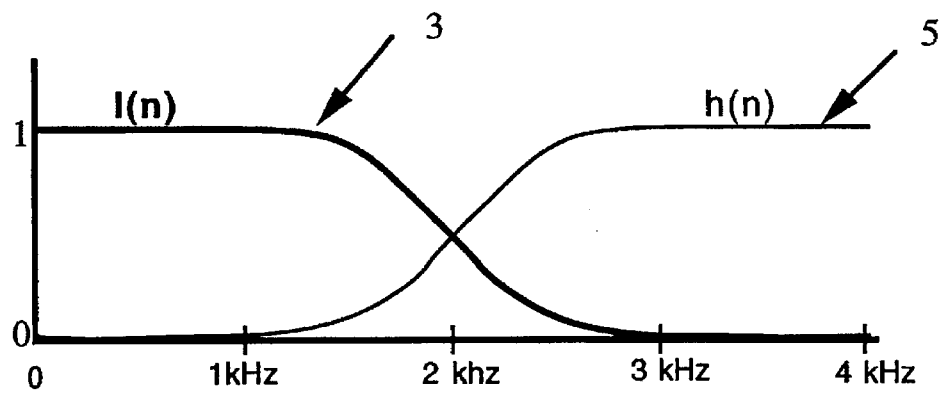
FIG. 2 is a first exemplary set of frequency response curves for a set of two complementary filters.

Another way to view complementary filters is that the frequency responses of filters l(n) and h(n) can be added together to form a unity response. If we assume an 8 kHz sampling rate in an example, we can represent frequencies between 0 and 4 kHz without aliasing. For example, one way to split up this frequency band is to assign filter 2 l(n) the frequencies between 0 and 2 kHz and filter 4 h(n) the frequencies between 2 kHz and 4 kHz. In FIG. 2, curves 3 and 5 illustrate the frequency response of filter 2 and 4 respectively.

Figure 3:
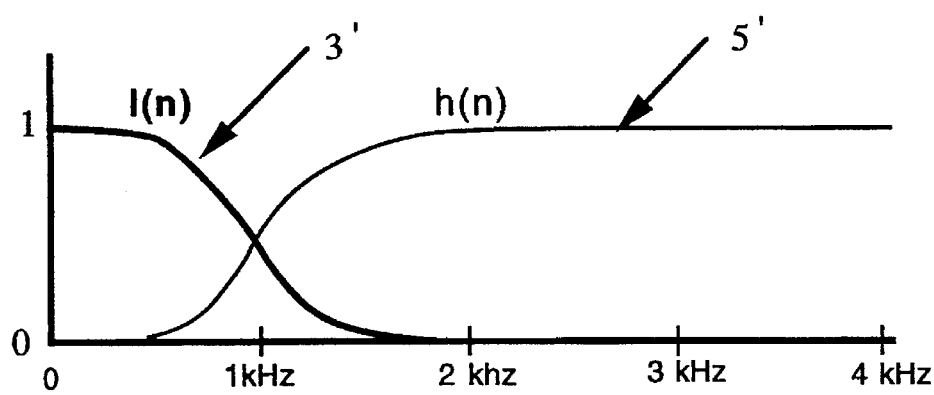
FIG. 3 is a second exemplary set of frequency response curves for a set of two complementary filters.

Although each filter has some leakage into the other band, the response of the other filter exactly compensates to make the sum of the frequency responses equal to unity. As another example, consider the frequency response of a pair of complementary filters as shown in FIG. 3, which assigns filter 2 l(n) the band from 0 to 1 kHz and filter 4 h(n) the band from 1 kHz to 4 kHz.

Figure 4:
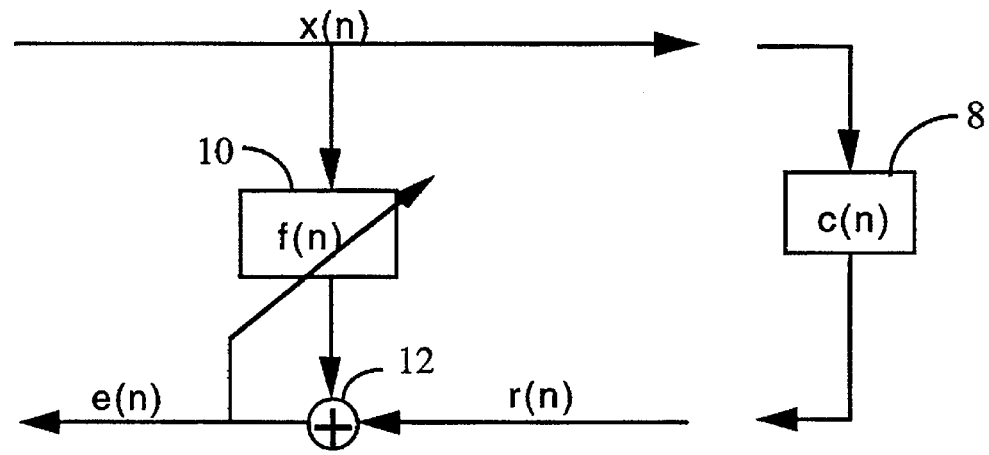
FIG. 4 is a block diagram of a typical echo canceller using a single adaptive filter.

FIG. 4 illustrates a traditional echo cancellation system. The far-end signal x(n) is transmitted through unknown echo channel 8 with impulse response c(n) and returns as an echo signal r(n). Though echo channel 8 is illustrated as an element in the FIG. 4, it is merely an artifact of the two to four wire conversion in the telephone network. In a network echo canceller, unknown echo channel 8 is a result of an impedance mismatch, and in an acoustic echo canceller unknown echo channel 8 is a result of the proximity of a loudspeaker and microphone.

Traditionally, the signal r(n) is filtered over the entire speech frequency band from 0–4 kHz by adaptive filter 10 with impulse response f(n). Adaptive filter 10 generates an estimate of the echo signal based upon the far-end signal x(n). The estimate of the echo signal is then subtracted from the echo signal r(n) by subtractor element 12 to produce the residual error signal e(n). The filter taps of f(n) are typically updated using an adaptation algorithm such as the Least-Mean-Square (LMS) method.

Figure 5:
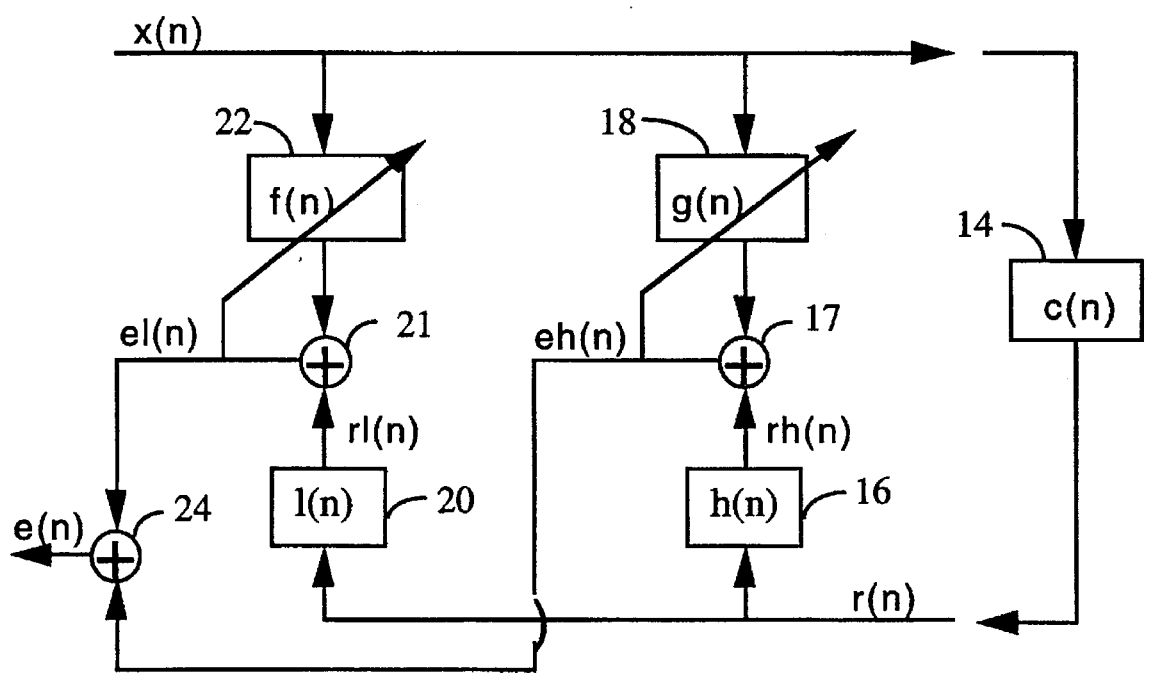
FIG. 5 is a block diagram of a typical echo canceller using dual adaptive filters.

In an exemplary embodiment, another way to accomplish this filtering is to use the apparatus of the present invention shown in FIG. 5, which prefilters the echo signal using a pair of complementary filters, filters 16 and 20. This apparatus filters signal r(n) into two frequency bands rl(n) and rh(n). Independent adaptive filters 22 and 18 generate estimates of the subband echo signal in accordance with the far-end signal x(n). The generated estimates are then subtracted from the far-end subband signals rh(n) and rl(n) by means of subtracting elements 21 and 17 respectively. Summing elements 21 and 17 then provide separately echo canceled subband signals el(n) and eh(n) respectively to summing element 24 which sums the signals to provide output error signal e(n).

The apparatus of the present invention permits adaptive filter 22 to only filter the echo response in the low band because the high band has been removed by filter 20. Similarly, adaptive filter 18 only filters the echo response in the high band, because the response in the low band has been removed by filter 16. By adding the low band residual error signal el(n) to the high band residual error signal eh(n), the residual error for the entire frequency band e(n) is obtained.

This technique can be easily generalized to N bands, where N>2. In this generalization a set of N prefilters each having a corresponding frequency response is used to provide a corresponding subband of the input signal. Each subband is then filtered by a separate and independent adaptive filter. In a preferred embodiment the frequency response curves of the set of prefilters would sum to unity over the frequency band of the input signal.

There are several advantages to adaptively filtering each frequency range separately. First, the gain of each filter can be adjusted to account for the varying amount of speech energy in each band. Second, the step size of each filter can be adjusted for the varying amount of noise in each band. Third, the additional information contained in the frequency decomposition of the two filters allows us to make more accurate state decisions.

Although the exemplary embodiment is directed toward the present invention in the environment of an echo canceller, it should be understood that the subband adaptive filter is readily applicable to other applications such as beam steering, digital communications receivers, equalizers, etc. The subband adaptive filter simply replaces the conventional adaptive filter in those applications.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An echo canceller for cancelling echo in a far-end signal characterized by a frequency spectrum, comprising:

a plurality of bandpass filter means, each bandpass filter means of said plurality of bandpass filter means for receiving an echo signal and for subband filtering said echo signal to provide a corresponding subband echo signal for a corresponding subband of the frequency spectrum;

a plurality of adaptive filter means, each adaptive filter means of said plurality of adaptive filter means for receiving the frequency spectrum of the far-end signal and generating a subband echo signal estimate for a corresponding subband of the frequency spectrum in accordance with filter taps values wherein said filter tap values of each of said plurality of adaptive filter means is determined in accordance with said far-end signal; and a plurality of subtracting means, each of said subtracting means for receiving a corresponding one of said subband echo signals and a corresponding one of said subband echo signal estimates and for subtracting said subband echo signal estimate from said subband echo signal to provide a corresponding subband echo canceled signal.

2. The system of claim 1 further comprising summing means for receiving each of said subband echo canceled signals and for summing said subband echo canceled signals to provide an echo canceled signal.

3. The system of claim 1 wherein each of said plurality of adaptive filter means is further for receiving said corresponding subband echo canceled signal and for adapting parametrically responsive to said corresponding subband echo canceled signal.

4. A method for canceling echo comprising the steps of:

receiving a far-end signal characterized by a frequency spectrum and an echo signal;

subband filtering the echo signal to provide a plurality of different subband echo signals, each subband echo signal being characterized by a respective portion of the frequency spectrum;

generating for each subband echo signal a corresponding subband echo estimate based on the entire frequency spectrum of the far-end signal; and subtracting each subband echo estimate from each respective subband echo signal to provide respective subband echo canceled signals.

5. The method of claim 4 further comprising the step of summing said subband echo canceled signals to provide an echo canceled signal.

6. The method of claim 4 wherein said generating step is further in response to said corresponding subband echo canceled signal.

\* \* \* \* \*